United States Patent [19]
Krut

[11] Patent Number: 5,460,659
[45] Date of Patent: Oct. 24, 1995

[54] CONCENTRATING PHOTOVOLTAIC MODULE AND FABRICATION METHOD

[75] Inventor: Dmitri D. Krut, Encino, Calif.

[73] Assignee: Spectrolab, Inc., Sylmar, Calif.

[21] Appl. No.: 169,441

[22] Filed: Dec. 10, 1993

[51] Int. Cl.⁶ ............................................. H01L 31/052
[52] U.S. Cl. ..................... 136/246; 136/244; 136/251; 136/259
[58] Field of Search ......................... 136/244, 246, 136/251, 259

[56] References Cited

U.S. PATENT DOCUMENTS

| | | | |
|---|---|---|---|
| 4,805,006 | 2/1989 | Yamaguchi et al. | 257/436 |
| 5,096,505 | 3/1992 | Fraas et al. | 136/246 |
| 5,180,442 | 1/1993 | Elias | 136/251 |

OTHER PUBLICATIONS

"Sandia's Baseline 3 Photovoltaic Concentrator Module", Proceedings of the 20th IEEE Photovoltaic Specialists Conference, Sep. 25–30 (1988) pp. 1318–1323.
VLSI Technology, ed. by S. M. Sze, Chap. 13, "Assembly Techniques and Packaging of VLSI Devices" by K. M. Striny, McGraw–Hill, (1988) pp. 566–611.
Progress in Photovoltaics: Research and Applications, vol. 1, 107–131 (1993), "Phased Development of High–concentration Photovoltaic Modules" by W. P. McNaughton et al.

Primary Examiner—Aaron Weisstuch
Attorney, Agent, or Firm—Elizabeth E. Leitereg; Terje Gudmestad; W. K. Denson-Low

[57] ABSTRACT

A solar cell assembly is fabricated by adapting efficient microelectronics assembly techniques to the construction of an array of small scale solar cells. Each cell is mounted on an individual carrier, which is a conventional integrated circuit (IC) package such as a dual-in-line package. Electrical connections are made between the cell and the carrier leads by automated wire bonding, followed by the emplacement of an optional secondary solar concentrator element if desired. The carriers are then automatically mounted and electrically connected to a common substrate, such as a printed circuit board, that has its own electrical interconnection network to interconnect the various cells. Finally, a primary concentrator lens assembly is placed over the array of cells. The resulting panel is thin and light weight, inexpensive to produce, allows for any desired interconnection to be made between the cells, and is capable of high conversion efficiencies.

12 Claims, 2 Drawing Sheets

CONCENTRATING PHOTOVOLTAIC MODULE AND FABRICATION METHOD

BACKGROUND OF THE INVENTION

1. Field of the Invention

This invention relates to concentrator solar cell modules and fabrication techniques, and more particularly to panels that use a large number of small size solar cells and light concentrating optics.

2. Description of the Related Art

Prior concentrator solar cell modules have generally employed a matrix of relatively large area solar cells, typically at least 12.5 mm per side for a square cell. The cells are individually mounted by hand onto a support panel, with output electrical lines also hand wired. A solar cell assembly of this type is described in Richards, "Sandia's Baseline 3 Photovoltaic Concentrator Module", Proceedings of the 20th IEEE Photovoltaic Specialists Conference., Sep. 25–30, 1988, pages 1318–1323. The need for hand assembly adds significantly to the cost of manufacture. In addition, during cell manufacturing a single point defect can spoil an entire cell. Furthermore, the manufacturing yield for the cells is limited because of their relatively large size.

Solar concentrator lenses that can be several hundred times the cell areas are mounted above the cells to concentrate received solar radiation onto their respective cells below. Since higher degrees of concentration yield higher conversion efficiencies, it is desirable that the concentractor lenses be kept relatively large in size. However, this also increases their focal lengths, requiring a depth on the order of a foot or more for the overall assembly. The large cell and lens areas result in panels that are relatively large and heavy; this adds to the difficulty of securely mounting them and especially of guiding their movements in a solar tracking mode.

A photovoltaic assembly with smaller solar cells, on the order of 3 mm per side, has been introduced by WattSun Corporation of Albuquerque, N.M. In this system the solar cells are hand bonded directly to a common copper substrate in a parallel circuit configuration. The concentration ratio is limited to about 30:1, rather than the desired range of several hundred to one, because the assembly methods employed do not allow for the high quality alignment of the solar cells. In addition, the WattSun approach does not permit the use of secondary focusing optics, which are necessary in systems with a light concentration over 100:1. The system is based upon silicon rather than high efficiency GaAs cells, since it is not economically compatible with GaAs. Thus, while the WattSun approach uses a larger number of smaller cells in place of the prior smaller number of large cells to obtain advantages in overall panel size and cell yield, its conversion efficiency is limited and it still employs costly manual fabrication techniques. Furthermore, the cells can only be connected in parallel to accumulate currents; the system is not compatible with a series connection for accumulating cell voltages, a configuration that is advantageous for the operation of the system.

SUMMARY OF THE INVENTION

The present invention seeks to provide a solar cell assembly and a related fabrication process that preserve the compactness and higher yield rates associated with the use of smaller cells, but at the same time can be implemented with low cost automated manufacturing techniques and is capable of very high conversion efficiencies.

These goals are realized by a unique adaptation of automated, high efficiency packaging techniques, of the type that have previously been used for microelectronics, to the construction of a solar cell assembly. Small solar cells, with surface areas of not more than about 10 mm$^2$ and preferably about 2 mm per square side, are mounted and electrically connected to microelectronic-type carriers, such as dual-in-line packages. After the optional attachment of secondary focusing elements, the various carriers are mechanically and electrically mounted to a common circuit board by a known technique such as through-hole or surface mounting; interconnections between the cells are made through the preassembled circuit board, rather then by having to hand wire each of the cells individually. Both the wire bonding used to electrically connect the cells with their respective carriers, and the mounting of the cells onto the circuit board, can be accomplished with available automated equipment.

The invention allows an array of solar concentrating lenses to be positioned close to the cells, typically only about 5 cm away, and yet achieve a concentration of sunlight in the range of about 400–600:1 with the use of secondary concentrator elements. It is also compatible with high efficiency cell materials such as GaAs. The mass production techniques used in the manufacturing, the elimination of separate cell-to-cell interconnects or wiring, and the reduction in panel size and weight all make the assembly less expensive and more reliable. Control, power conditioning circuitry and by-pass diodes can be easily added to the same circuit board used for the cell carriers, and maintenance requirements are simplified.

These and other features and advantages of the invention will be apparent to those skilled in the art from the following detailed description, taken together with the accompanying drawings.

DETAILED DESCRIPTION OF THE INVENTION

In contrast to the manual assembly techniques used in the past, the present invention adapts efficient integrated circuit (IC) microelectronic packaging technology, as well as circuit board electronics manufacturing technology, to reduce the overall system cost, size and weight of a concentrator photovoltaic array. New manufacturing equipment is not necessary; existing IC packaging facilities can be used for individual solar cell modules. A full compatibility with existing microelectronics packaging technology is readily attainable. Currently available microelectronics assembly and packaging techniques are discussed in general in VLSI Technology, ed. by S.M. Sze, Chap. 13 "Assembly Techniques and Packaging of VLSI Devices" by K. M. Striny, McGraw-Hill, 1988, pages 566–611.

The basic approach taken by the invention is to mount small solar cells on individual standard IC carriers, mechanically and electrically attach the carriers to a substrate such as a printed circuit board that has its own electrical interconnection network, and automatically connect the cells to each other via the existing substrate network. The fabrication process can be highly automated with the use of existing microelectronics packaging equipment, and allows any desired interconnections to be made between the separate solar cells.

Figure 1:
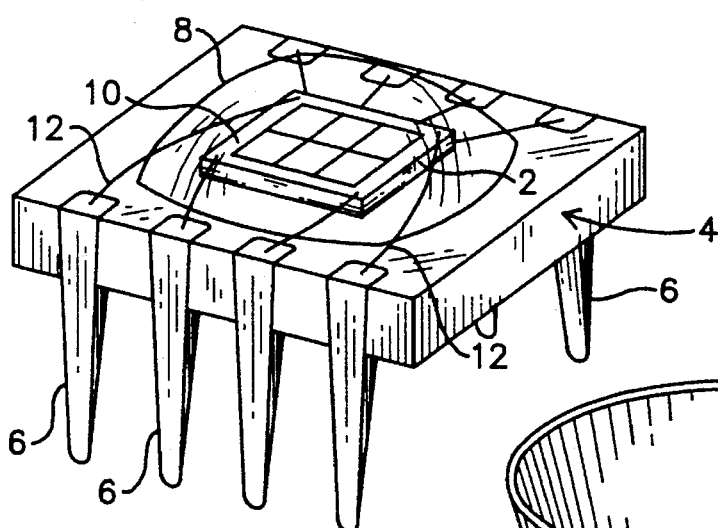
FIG. 1 is a perspective view of a solar cell mounted on a microelectronic-type carrier in accordance with the invention, with a secondary collector lens.

FIG. 1 illustrates an individual solar cell package. A cell 2 is mounted on a standard IC-type carrier 4, such as the DIP package shown in the figure. A series of stiff lead wires or pins 6 extend down from opposite edges of the carrier for mounting and electrically connecting the carrier to a circuit board. An optional refractory secondary concentrator element in the form of a lens 8 is positioned over the cell to collect any incident solar radiation that would otherwise miss the cell, and refract the radiation onto the cell's upper surface. The solar cell 2 is small, preferably with a square shape about 2 mm long on each side, and in any event no greater than about 10 mm². It can be formed either from conventional silicon, or from a material with a higher photovoltaic conversion efficiency such as GaAs, a very high efficiency form of silicon, or GaInP/GaAs. Various cell structures may be used, including pn junctions, Schottky barriers, and photoelectrochemical cells. With GaAs, the cells are grown on a GaAs or Ge wafer, preferably using metal organic chemical vapor deposition (MOCVD). Top and bottom contacts are then photolithographically established for each cell within the larger wafer. The cells can then be tested with a conventional microelectronics tester, followed by slicing or dicing the wafer into small cell dies.

The fabrication of the cell per se is conventional, except the wafer is divided into much smaller dies than any of the prior cell assemblies except for the WattSun assembly. In addition to facilitating the use of microelectronics packaging techniques in accordance with the invention, the small cell size also reduces the incidence of point defects and thus improves yields.

When it is completed, the die 2 is attached to the upper surface of the carrier 4 with the use of a conductive epoxy, thermal bonding, or other desired adherent mechanism. The carrier 4 has a surface area upon which the cell 2 is mounted which is not more than about 15 mm². With an active 2×2 mm solar cell area, a 0.25 mm metallized border 10 is typically provided to act as a bus and wire bonding pad. This small size permits a very large number of cells to be fabricated from a single wafer. Asi0 assuming the dimensions stated above, 256 cells can be produced from a single 45×45 mm wafer, allowing for the border and the dicing Kerf. Cells are isolated using a mesa isolation or a saw cut method.

After the cell 2 has been attached to the carrier 4, its upper bonding pad 10 is electrically connected to the carrier pins 6 on one side of the carrier by wire bonds 12. The wire bonds can be established with a standard tape automated bonding (TAB) machine, such as the programmable Hughes Aircraft Company Autobonder HMC 2460 or 2470. With the 8-lead DIP illustrated, and assuming a pn junction cell, only four wire bonds are needed for the p contact on the upper surface of the cell; the underside of the cell is automatically connected to the ground pins 6 on the opposite side of the DIP by connectors built into the carrier. Four of the carrier pins are thus used for the p-contact, and the other four for the n-contact. The secondary collector lens 8 is mounted to the cell after the wire bonds have been completed.

Figure 2:
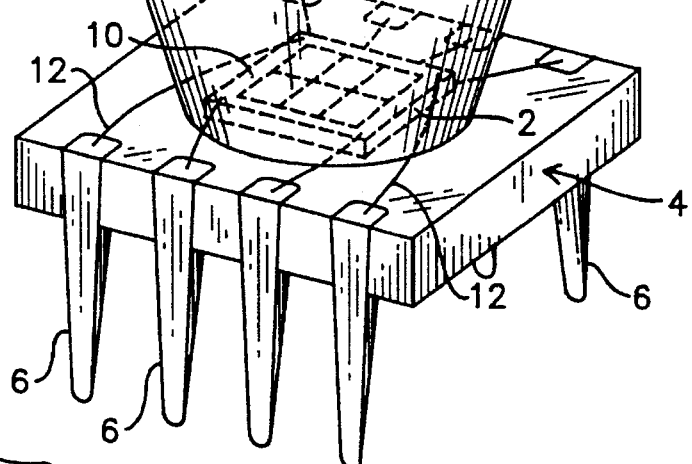
FIG. 2 is a perspective view similar to FIG. 1, but with a solar collector cone substituted for the lens.

FIG. 2 illustrates an alternate secondary collector mechanism for the same cell 2 and carrier 4 assembly. In this case the secondary collector consists of a cone 14 with an inner reflective surface that is adhered to the carrier's upper surface, surrounding the cell 2. The reflective cone 14 is typically metallic, and can either be hollow or filled with a transparent material such as glass. As with the lens 8 of FIG. 1, the cone's collection area would be about 3×3 mm for a cell with a 2×2 mm active area.

Figure 3:
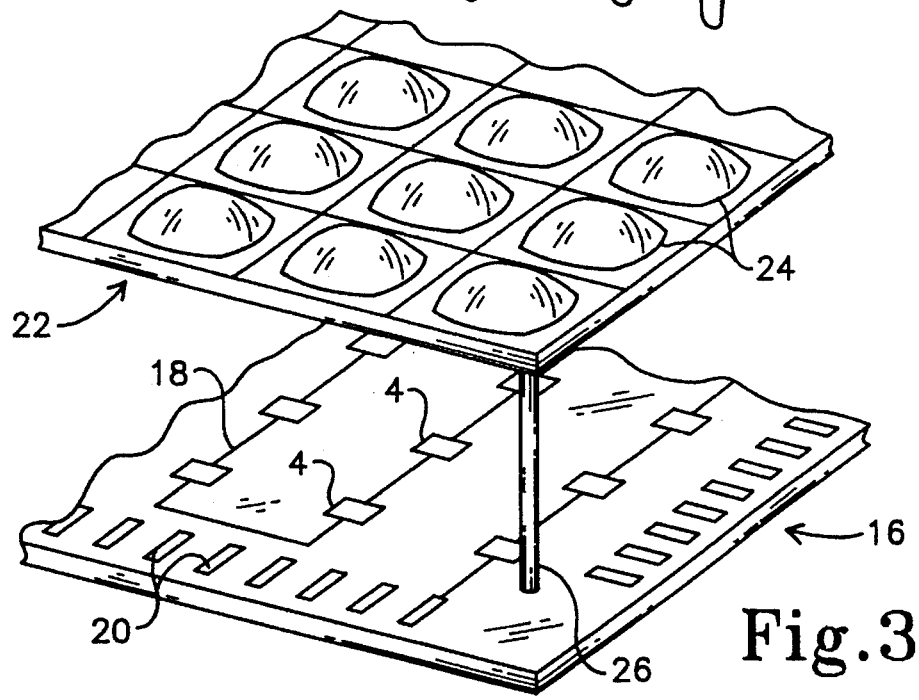
FIG. 3 is a fragmentary perspective view of a solar cell panel in accordance with the invention.

In the next step of the fabrication, illustrated in FIG. 3, the carriers 4 with the cells mounted on them, along with the optional secondary collector elements if desired, are mounted on a substrate 16 that includes its own electrical interconnection network. The substrate 16 is illustrated as a printed circuit board with surface metallic leads 18 that interconnect the cells with each other and with edge connector pads 20. It can also be implemented as a printed wiring board with an internal electrical interconnection network, or by some other desired device that provides both a mechanical mounting surface and electrical interconnections.

The printed circuit board or printed wiring board upon which the carriers 4 are mounted is preferably of conventional design; fabrication techniques for these types of boards are well known. The cell carriers are preferably mounted to the board with an automated "pick and place" machine that is commonly used for microelectronic printed circuit board manufacturing.

An array 22 of primary concentrating lenses is positioned over the cells, after they have been mounted on the circuit board 16, to concentrate incident solar radiation onto the cells. Each lens 24 in the array 22 is aligned over a respective cell in a single alignment operation and is spaced from the respective cell by a distance approximately equal to the width of the lens. They can be formed as either Fresnel or curved surface refractory lenses on a transparent acrylic sheet; such sheets are currently available in dimensions compatible with the invention. The lenses are held in place over the cell array by means of standoffs 26, or by placing the circuit board 16 inside a housing and covering the housing with the lens array.

Both the cells and the primary lenses 24 would generally be provided in 6×6 arrays, although only a 3×3 array is shown in FIG. 3 for simplification. With 2×2 mm active cell areas, each primary lens is preferably a square with sides about 5 cm long; this produces a highly desirable concentration ratio of about 625:1. With a 6×6 lens array, the resulting panel would be a square about 30 cm along each side.

The small cell size also makes possible the achievement of a desirably thin panel. The focal lengths of the primary lenses 24 are typically comparable to the lens size, so that an approximately 5–6 cm thickness is achievable with 5×5 cm primary lenses.

The solar cells can be connected in parallel to accumulate their current outputs, in series to accumulate their voltage outputs, or in any other desired manner by simply designing the interconnection network on the circuit board 16 accordingly. Outputs from the cells are taken from the edge connector pads 20 on the board, thereby eliminating any requirement for hard wiring to the cells themselves. The same circuit board can also be provided with circuitry for related functions, such as a power conditioning circuit to maintain a constant voltage, or circuits to convert the cell outputs to an AC voltage or to a higher DC voltage. Additional packaging convenience and lower assembly costs may be achieved by using the same circuit board for both the solar cells and for the related circuitry.

Figure 4A:
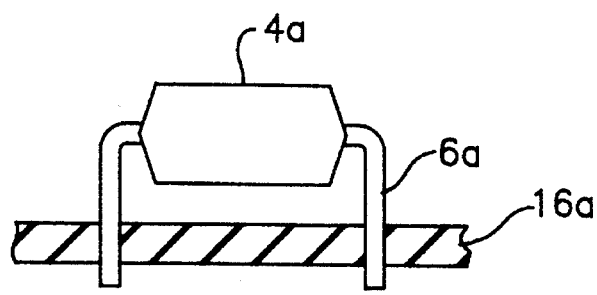
FIGS. 4a–4f are sectional views showing various methods for mounting a solar cell carrier onto a printed circuit board.
Figure 4B:
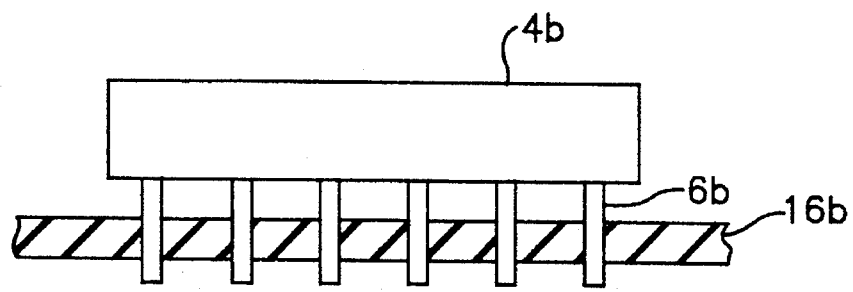
Figure 4C:
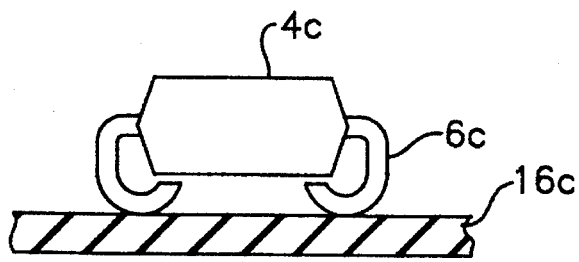
Figure 4D:
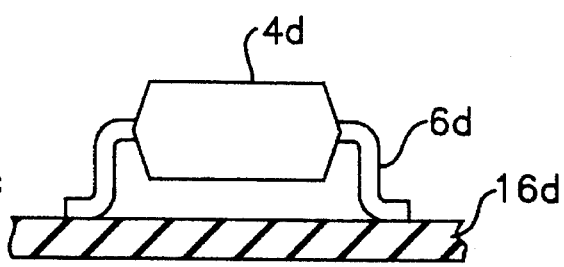
Figure 4E:
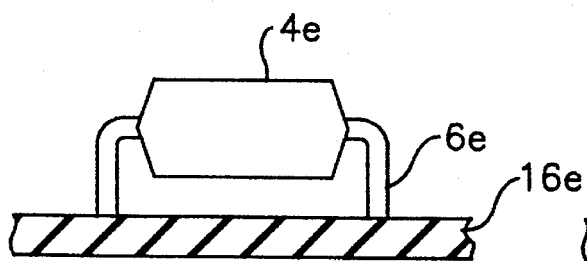
Figure 4F:
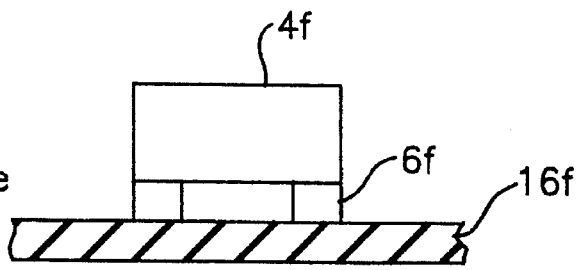

Numerous different microelectronic techniques are available for mounting the cell carriers 4 to the circuit board 16; some of these are illustrated in FIGS. 4a–4f. FIGS. 4a and 4b respectively show a DIP 4a and a pin-grid-array (PGA) package 4b mounted via output pins 6a and 6b on through-hole circuit boards 16a and 16b. FIGS. 4c–4f show typical surface mounted packages, with a "J" leaded package 4c, gull-wing-leaded package 4d, butt leaded DIP 4e and leadless type ceramic chip carrier 4f mounted on matching interconnection substrates 16c–16f, respectively. The packages 4c–4e are mounted via respective output pins 6c–6e, while the leadless package 4f includes leads that extend through the carrier and are solder bonded to the interconnection substrate 16f.

While several different embodiments have been shown and described, numerous variations and alternative embodiments will occur to those skilled in the art. Accordingly, it is intended that the invention be limited only in terms of the appended claims.

I claim:

1. A high efficiency solar cell assembly, comprising:
   a plurality of IC-type semiconductor device packages,
   a plurality of solar cells mounted on and electrically connected to respective packages,
   a printed circuit board that includes an electrical interconnection network,
   said packages mounted on and electrically connected to said board so that said solar cells are electrically interconnected through said electrical interconnection network,
   a plurality of discrete solar concentrator elements, each mounted on respective cell packages over respective cells for concentrating received solar radiation onto their respective cells, and
   an array of solar concentrating lenses mounted above said solar cells and said discrete solar concentrator elements, each lens of said array extending over a substantially greater area than the area of each respective cell, said array for receiving solar radiation and concentrating said radiation through said discrete elements onto said cells.

2. The solar cell assembly of claim 1, wherein said semiconductor device packages are dual-in-line (DIP) packages.

3. The solar cell assembly of claim 1, wherein said semiconductor device packages are pin grid array (PGA) packages.

4. The solar cell assembly of claim 1, wherein said solar cells are wire bonded to at least some of their respective package leads.

5. The solar cell assembly of claim 4, wherein said package leads are through-hole mounted to said substrate.

6. The solar cell assembly of claim 4, wherein said package leads are surface mounted to said substrate.

7. The solar cell assembly of claim 1, wherein the surface areas of said packages upon which said cells are mounted are not more than about 15 mm$^2$.

8. The solar cell assembly of claim 1, wherein said lens array is spaced from said solar cells by a distance approximately equal to the widths of said lenses.

9. The solar cell assembly of claim 1, each said solar cell having a solar radiation receiving surface with an area of not more than about 10 mm$^2$.

10. A method of fabricating a solar cell array, comprising:
    forming a plurality of individual solar cell dice,
    mounting said solar cell dice on respective IC-type carriers that have respective conductive leads extending therefrom,
    electrically connecting said solar cell dice to leads of their respective carriers,
    mechanically and electrically attaching said carrier leads to a substrate having an electrical interconnection network to mount and electrically interconnect said carriers on said substrate,
    mounting discrete solar concentrating elements over respective dice,
    mounting a matrix of concentrator lenses over said discrete elements above said solar cell dice, and
    concentrating solar radiation received by said matrix of lenses through said discrete elements onto respective dice.

11. The method of claim 10, wherein at least some of said solar cell dice are connected to leads on their respective carriers by auto wire bonding.

12. The method of claim 10, wherein said carrier leads are automatically attached to said substrate.

* * * * *